United States Patent
Zhang et al.

(10) Patent No.: US 11,738,411 B2
(45) Date of Patent: Aug. 29, 2023

(54) LEAD-FREE SOLDER PASTE WITH MIXED SOLDER POWDERS FOR HIGH TEMPERATURE APPLICATIONS

(71) Applicant: INDIUM CORPORATION, Utica, NY (US)

(72) Inventors: Hongwen Zhang, New Hartford, NY (US); Samuel Lytwynec, Chadwicks, NY (US); Huaguang Wang, New Hartford, NY (US); Jie Geng, New Hartford, NY (US); Francis M. Mutuku, Utica, NY (US); Ning-Cheng Lee, New Hartford, NY (US)

(73) Assignee: INDIUM CORPORATION, Utica, NY (US)

( * ) Notice: Subject to any disclaimer, the term of this patent is extended or adjusted under 35 U.S.C. 154(b) by 72 days.

(21) Appl. No.: 17/244,141

(22) Filed: Apr. 29, 2021

(65) Prior Publication Data

US 2021/0339344 A1 Nov. 4, 2021

Related U.S. Application Data

(60) Provisional application No. 63/017,469, filed on Apr. 29, 2020.

(51) Int. Cl.
 *B23K 35/26* (2006.01)
 *B23K 1/20* (2006.01)
 (Continued)

(52) U.S. Cl.
 CPC ............ *B23K 35/262* (2013.01); *B23K 1/203* (2013.01); *B23K 35/025* (2013.01); *B23K 35/362* (2013.01); *B23K 2103/08* (2018.08)

(58) Field of Classification Search
 CPC .......................... B23K 35/262; B23K 35/025
 (Continued)

(56) References Cited

U.S. PATENT DOCUMENTS

2006/0151889 A1 7/2006 Kajiwara et al.
2020/0398382 A1\* 12/2020 Sakamoto ............ B23K 35/262

FOREIGN PATENT DOCUMENTS

EP 3708290 9/2020
JP 2002-001573 1/2002
(Continued)

OTHER PUBLICATIONS

International Search Report and Written Opinion dated Jul. 16, 2021 for International Application No. PCT/US2021/029871, filed Apr. 29, 2021.

*Primary Examiner* — Weiping Zhu
(74) *Attorney, Agent, or Firm* — Sheppard, Mullin, Richter & Hampton LLP

(57) ABSTRACT

Some implementations of the disclosure relate to a lead-free solder paste with mixed solder powders that is particularly suitable for high temperature soldering applications involving multiple board-level reflow operations. In one implementation, the solder paste consists of 10 wt % to 90 wt % of a first solder alloy powder, the first solder alloy powder consisting of an SnSbCuAg solder alloy that has a wt % ratio of Sn:Sb of 0.75 to 1.1; 10 wt % to 90 wt % of a second solder alloy powder, the second solder alloy powder consisting of an Sn solder alloy including at least 80 wt % of Sn; and a remainder of flux.

18 Claims, 4 Drawing Sheets

(51) Int. Cl.
*B23K 35/02* (2006.01)
*B23K 35/362* (2006.01)
*B23K 103/08* (2006.01)

(58) Field of Classification Search
USPC .......................................................... 420/557
See application file for complete search history.

(56) References Cited

FOREIGN PATENT DOCUMENTS

| | | | |
|---|---|---|---|
| JP | 2005-340267 | 12/2005 | |
| WO | WO 2019/198690 | 10/2019 | |
| WO | WO-2019198690 A1 * | 10/2019 | ......... B23K 35/0244 |

\* cited by examiner

LEAD-FREE SOLDER PASTE WITH MIXED SOLDER POWDERS FOR HIGH TEMPERATURE APPLICATIONS

CROSS-REFERENCE TO RELATED APPLICATIONS

This application claims the benefit of U.S. Provisional Patent Application No. 63/017,469, filed on Apr. 29, 2020 and titled "Lead-free Solder Paste with Mixed Solder Powders For High Temperature Applications," which is incorporated herein by reference in its entirety.

TECHNICAL FIELD

The present disclosure relates to lead-free solder pastes.

DESCRIPTION OF THE RELATED ART

Lead (Pb) generated by the disposal of electronic assemblies is considered hazardous to the environment and human health. Regulations increasingly prohibit the use of Pb-based solders in the electronic interconnection and electronic packaging industries. The Restriction of Hazardous Substances Directed (RoHS) directive of Jul. 1, 2006 has led to successful replacement of SnPb solder alloys with Pb-free solder alloys. SnAg, SnCu, and SnAgCu (SAC) based solders have become popular solders to form interconnections in the semiconductor and electronics industries. However, the development of high melting temperature Pb-free solders to replace the conventional high lead ones (e.g., Pb-5Sn & Pb-5Sn-2.5Ag) is still at an early stage.

A common use of high melting temperature solders is die-attachment for semiconductor surface mounting devices/components in which the chip will be bonded between leads or onto a lead frame. These surface mounting components/devices are then used in one or more subsequent board-level soldering processes. For example, a silicon die is soldered onto a lead-frame using a high melting temperature solder to form an assembly. Subsequently, the device (either encapsulated or not), is attached onto a printed wiring board (PWB) by a board-level reflow. The same board may be exposed to multiple reflows. During the whole process, the internal connection between the silicon die and the lead-frame should be well maintained. This requires that the high melting temperature solder resist multiple reflow soldering processes without causing any functional failures.

Transient liquid phase bonding (TLPB) technology is aimed at achieving a higher remelting temperature of a solder joint through the formation of intermetallic compounds (IMCs) between low melting temperature alloys and high melting temperatures alloys. In a TLPB design, the low melting phase is mostly or even completely consumed during reflow to reach the high melting temperature target. The interfacial IMC formation on the surface of the high melting alloys and the continuous IMC growth come at the expense of both low melting alloys and high melting alloys during the reflow.

SUMMARY

Some implementations of the disclosure are directed to a lead-free solder paste with mixed solder powders that is particularly suitable for high temperature soldering applications involving multiple board-level reflow operations.

In one embodiment, a solder paste consists of: 10 wt % to 90 wt % of a first solder alloy powder, the first solder alloy powder consisting of an SnSbCuAg solder alloy that has a wt % ratio of Sn:Sb of 0.75 to 1.1; 10 wt % to 90 wt % of a second solder alloy powder, the second solder alloy powder consisting of an Sn solder alloy including at least 80 wt % of Sn; and a remainder of flux.

In some implementations, the solder paste consists of 50 wt % to 90 wt % of the first solder alloy powder, 10 wt % to 50 wt % of the second solder alloy powder, and a remainder of the flux. In some implementations, the solder paste consists of 75 wt % to 90 wt % of the first solder alloy powder, 10 wt % to 25 wt % of the second solder alloy powder, and a remainder of the flux.

In some implementations, the solder paste consists of less than 50 wt % of the first solder alloy powder, greater than 50 wt % of the second solder alloy powder, and a remainder of the flux.

In some implementations, the solidus temperature of the first solder alloy powder is 300° C. to 360° C., and wherein the solidus temperature of the second solder alloy powder is 200° C. to 250° C. In some implementations, the solidus temperature of the second solder alloy powder is 215° C. to 245° C. In some implementations, the liquidus temperature of the first solder alloy powder is no greater than 360° C. In some implementations, the liquidus temperature of the second solder alloy powder is no greater than 250° C. In some implementations, the liquidus temperature of the second solder alloy powder is no greater than 245° C.

In some implementations, the first solder alloy powder consists of: 4 wt % to 10 wt % of Cu; 4 wt % to 20 wt % of Ag; optionally, 0.5 wt % or less of Bi, Co, In, Ge, Ni, P, or Zn; and a remainder of Sn and Sb in the ratio of 0.75 to 1.1.

In some implementations, the second solder alloy powder is SnAg, SnCu, SnAgCu, SnSb, SnAgCuSb, SnAgY (Y=Bi, Co, Ge, In, Ni, P, Sb, or Zn), SnCuY (Y=Bi, Co, Ge, In, Ni, P, Sb, or Zn), SnAgCuY (Y=Bi, Co, Ge, In, Ni, P, Sb, or Zn), or SnAgCuSbY (Y=Bi, Co, Ge, In, Ni, P, Sb, or Zn).

In some implementations, the second solder alloy powder comprises 0.1 to 4 wt % Ag, 0.1 to 1 wt % Cu, or 0.1 to 11 wt % Sb. In some implementations, the second solder alloy powder comprises 0.1 to 4 wt % Ag, 0.1 to 1 wt % Cu, and 0.1 to 11 wt % Sb.

In some implementations, the second solder alloy powder is doped with Bi, Co, Ge, In, Ni, P, Sb, or Zn.

In some implementations, a ratio of heat absorption from a first melting peak of the solder paste to heat absorption from a second melting peak of the solder paste is 0.15 or less.

In one embodiment, a method comprises: applying a solder paste between a substrate and device to form an assembly, wherein the solder paste consists of: 10 wt % to 90 wt % of a first solder alloy powder, the first solder alloy powder consisting of an SnSbCuAg solder alloy that has a wt % ratio of Sn:Sb of 0.75 to 1.1; 10 wt % to 90 wt % of a second solder alloy powder, the second solder alloy powder consisting of an Sn solder alloy including at least 80 wt % of Sn; and a remainder of flux; performing a first reflow soldering process with the assembly at a peak temperature of greater than 320° C. to form a solder joint from the solder paste; and after forming the solder joint, performing a second reflow soldering process with the assembly at a peak temperature of 230° C. to 270° C. In some implementations, the device is a silicon die, the substrate comprises a Cu lead frame, and the solder paste is applied between the Cu lead frame and the silicon die. In some implementations, the solder joint maintains a bond shear strength greater than or equal to 10 MPa during the second reflow soldering process.

In one embodiment, a solder joint is formed by the process of: applying a solder paste between a substrate and a device to form an assembly; and reflow soldering the assembly to form the solder joint; wherein the solder paste consists of: 10 wt % to 90 wt % of a first solder alloy powder, the first solder alloy powder consisting of an SnSbCuAg solder alloy that has a wt % ratio of Sn:Sb of 0.75 to 1.1; 10 wt % to 90 wt % of a second solder alloy powder, the second solder alloy powder consisting of an Sn solder alloy including at least 80 wt % of Sn; and a remainder of flux.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations.

Figure 1:
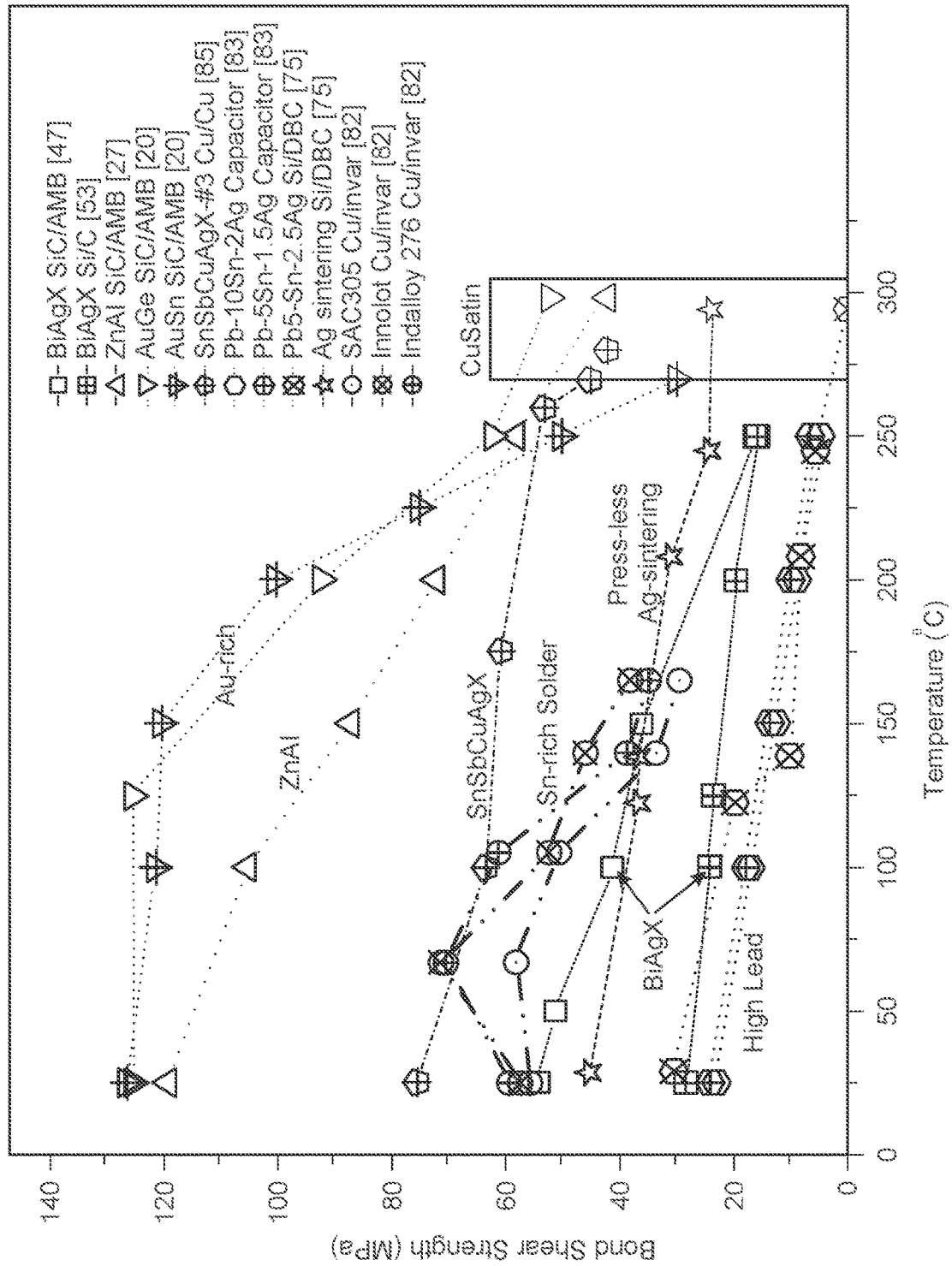
FIG. 1 is a chart showing bond shear strength in MPa as a function of temperature for several lead-free bonding materials and high-lead solders.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In order to be compatible with solder reflow profiles used in the electronics industry, some important characteristics of high temperature solders may include: (i) a solidus temperature of around 260° C. and above (in accordance with typical SMT solder reflow profiles), (ii) good thermal fatigue resistance, (iii) high thermal/electric conductivity, and/or (iv) low cost. To date, solders with a high lead content still dominate die-attachment applications in the power discrete market.

Implementations of the disclosure are directed to a lead-free solder paste with mixed solder powders that is particularly suitable for high temperature soldering applications involving multiple board-level reflow operations. The solder paste comprises two solder powders and flux. One of the solder powders has a substantially higher melting temperature than the other solder powder. For example, one of the solder powders may have a solidus temperature of a first solder alloy that is from 300 to 360° C., and the other of the solder powders may have a solidus temperature of a second solder alloy from 200 to 250° C. The higher solidus temperature (higher temperature) solder powder is an SnSb-based solder alloy having an Sn:Sb weight ratio between about 0.75 and 1.1. The lower solidus temperature (lower temperature) solder powder is an Sn-rich solder or solder alloy with an Sn content greater than 80% by weight.

The higher temperature solder powder comprises 50 wt % to 90 wt % of the solder paste, the lower temperature solder powder comprises 10 wt % to 50 wt % of the solder paste, and the flux comprises 9 wt % to 20 wt % of the solder paste. As further described below, by virtue of this composition, the higher temperature solder powder may dominate the high temperature performance of the final bonding joint, including the melting and the thermo-mechanical behavior. The ductile Sn-rich solder powder may improve wetting during reflow and enhance the ductility of the final joint. Additionally, the existence of the Sn-rich solder inside the paste may permit a relatively lower reflow temperature.

In accordance with some implementations of the disclosure, further described below, the selection of the lower temperature solder powder and the higher melting temperature solder powder in the solder paste may be made to satisfy one or more of the following properties: (1) the solder powders completely or partially dissolve into each other during the reflow process; 2) after reflow soldering, the remaining low melting phase in the final joint is optimized in quantity and isolated by the high melting SnSb matrix to maintain a desired joint mechanical performance at a temperature above 270° C.; and (3) the solder joint is able to survive a temperature cycle test for typical die attachment applications. In practice, both solder alloy powders may thoroughly or partially dissolve in to each other during reflow. This permits the continuous dissolution of the high temperature solder alloy powder into a liquid solution and no interfacial IMC formation on the powder's surface to slow down the dissolution. In design, the ratio of the lower temperature alloy powder and the higher temperature alloy powder may be optimized to allow the higher temperature alloy powder to dominate the high temperature performance of the final joint while the low melting phases are isolated inside the high melting phase matrix.

The solder pastes described herein may be used for a variety of high temperature soldering applications, including die attachment and surface mounting of components devices.

FIG. 1 is a chart showing bond shear strength in megapascal (MPa) as a function of temperature for joints formed from several lead-free bonding materials and high-lead solders. As depicted, most of the lead-free solders have higher bond shear strength than the high-lead ones. Sn-rich solders significantly drop in bond shear strength when approaching the melting temperature of the solder (about 217° C. for SnAgCu and 243° C. for Sn10Sb). After reaching the melting temperature, the bond shear strength of the Sn-rich solders drops close to zero as they become molten. As such, because of the lower melting temperatures of Sn-rich solders, they may not be able to maintain any bond shear strength at high melting temperatures. By comparison, the high lead solders have a bond shear strength around 10 Mpa at 250° C., and the bond shear strength drops even lower at higher temperatures. Surface mounting devices with high lead solders as the die attach materials have been proven to survive subsequent SMT reflows at up to 260° C. peak temperatures. Thus, the novel solder pastes described herein are designed to maintain a bond shear strength above 10 MPa even at a temperature of 270° C. or higher, superior to high lead counterparts, to survive the following SMT process.

SnSbCuAgX (X=Bi, Co, Ge, In, Ni, P, Zn, or some other dopant) alloys with a wt % ratio of Sn:Sb that is about 0.75 to 1.1 are a group of high temperature solder alloys having the solidus/liquidus temperature range between about 300° C. to 360° C. As depicted by FIG. 1, an SnSbCuAgX alloy is able to well maintain the high temperature bond shear strength at temperatures up to about 280° C. However, SnSbCuAgX alloys are rigid and brittle. For Si on Cu die-attachment tests, SnSbCuAgX solders will cause the Si die to break during temperature cycling tests, or even right after reflow because they are too rigid to accommodate the strain caused by the coefficient of thermal expansion (CTE) mismatch between Si and Cu. Therefore, SnSbCuAgX solder alloys, by themselves, are not suitable for die attachment in die attach applications.

Although SnSbScuAgX solder alloys and Sn-rich solder alloys may not be individually suitable for high temperature soldering applications, if the benefits of the two solder alloys could be combined while minimizing or eliminating their respective weaknesses, the combination could be a suitable lead-free alternative to lead-based solder alloys. In accordance with the present disclosure, the benefits of both solder alloys may be achieved by forming a solder paste that is a combination of a Sn-rich solder alloy powder, a SnSbCuAgX solder alloy powder, and a flux.

The solder paste described herein may be reflowed to form a solder joint. The reflowed solder joint may demonstrate the benefits of both solder alloys: the ductility of Sn-rich alloys and the high temperature performance of SnSbCuAgX solder alloys. To achieve these benefits, the ratio of the Sn-rich powder to the SnSbCuAgX powder may be chosen such that final joint exhibits (1) good mechanical strength (>10 MPa) at 270° C. or even higher; (2) and good ductility to accommodate the strain caused by the CTE mismatch between the Si die and Cu. To achieve these benefits, the solder joint may be formed with a morphology that the Sn-rich phase of the low temperature solder alloy is embedded in the SnSb matrix of the high temperature solder alloy, similar to composite materials. The Sn-rich phase isolated inside the SnSb matrix may not significantly impact the high temperature strength of the solder joint because the majority of the solder joint is the SnSb matrix and the reinforced Cu-containing and Ag-containing particles. At the same time, the ductile Sn-rich phase may easily deform through creep to accommodate the strain caused by the CTE mismatch between the Si die and the Cu lead frame at least partially.

Figure 2:
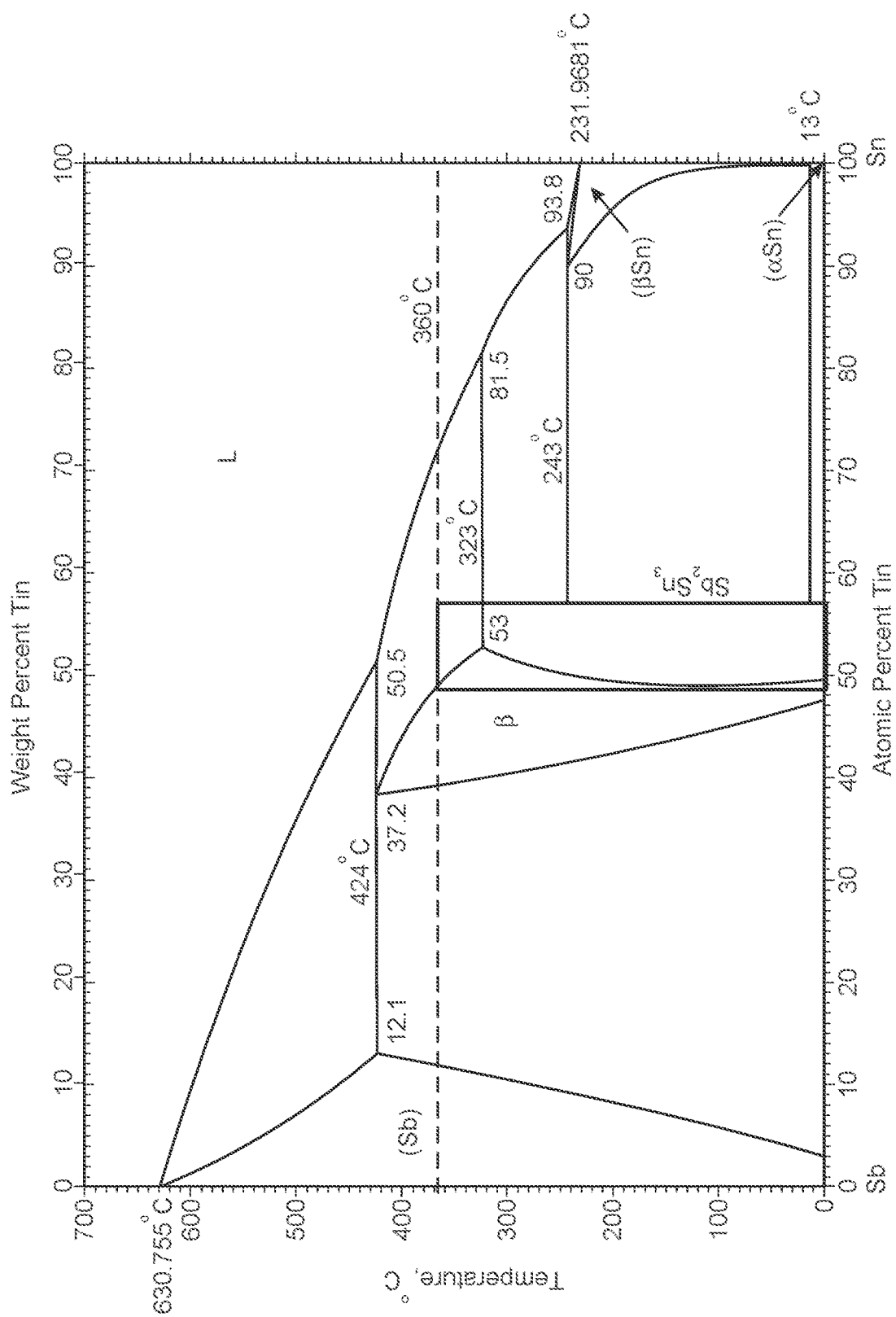
FIG. 2 depicts a phase diagram of SnSb.

As discussed above, the higher temperature solder alloy, with a majority (>50 wt %) in the solder paste, may dominate high melting temperature performance at about 270° C. and above. To achieve this benefit, the ratio between Sn and Sb in the higher temperature solder alloy may be maintained at about 0.75 to 1.1, in which a Sn3Sb2 intermetallic compound and SnSb solid solution (β) are formed and have a melting temperature between about 323° C. and 360° C. This is depicted by the phase SnSb phase diagram of FIG. 2. To increase ductility, Cu and Ag are alloyed into the SnSb alloy such that Ag3Sn and Cu6Sn5 particles together with Sn3Sb2 particles are precipitated inside the SnSb matrix to slow down the dislocation movement and the following crack nucleation and growth. However, depending on the amount of Cu and Ag that is added, the solidus temperature of the solder alloy may be maintained around 300° C. depending on the content. Accordingly, in some implementations, it is preferable that the high melting temperature solder alloy has about 4 wt % to 10 wt % Cu and about 4 wt % to 20 wt % Ag.

Table 1 below, shows examples of SnSbCuAg alloys that may be utilized for the higher temperature solder alloy, in accordance with implementations of the disclosure. In some implementations, less than 0.5% of dopants, such as Bi, Co, In, Ge, Ni, P, or Zn, may be added to the SnSbCuAg solder alloy to stabilize the precipitates and the interfacial IMC.

TABLE 1

| # | Sn (wt %) | Sb (wt %) | Cu (wt %) | Ag (wt %) |
|---|---|---|---|---|
| 1 | 38 | 38 | 7 | 17 |
| 2 | 38 | 38 | 10 | 14 |
| 3 | 38 | 42 | 5 | 15 |
| 4 | 38 | 42 | 8 | 12 |
| 5 | 39 | 41 | 5 | 15 |
| 6 | 39 | 41 | 8 | 12 |
| 7 | 39 | 41 | 10 | 10 |
| 8 | 40 | 40 | 5 | 15 |
| 9 | 40 | 40 | 8 | 12 |
| 10 | 40 | 41 | 5 | 14 |
| 11 | 40 | 41 | 8 | 11 |
| 12 | 41 | 39 | 8 | 12 |
| 13 | 41 | 39 | 10 | 10 |
| 14 | 41 | 41 | 5 | 13 |
| 15 | 41 | 41 | 8 | 10 |

TABLE 1-continued

| # | Sn (wt %) | Sb (wt %) | Cu (wt %) | Ag (wt %) |
|---|---|---|---|---|
| 16 | 42 | 42 | 6 | 12 |
| 17 | 42 | 42 | 5 | 13 |
| 18 | 42 | 43 | 5 | 10 |
| 19 | 42 | 43 | 8 | 7 |
| 20 | 43 | 42 | 5 | 10 |
| 21 | 43 | 43 | 5 | 9 |
| 22 | 43 | 43 | 8 | 6 |
| 23 | 44 | 42 | 5 | 9 |
| 24 | 44 | 42 | 8 | 6 |
| 25 | 44 | 43 | 5 | 8 |
| 26 | 44 | 44 | 5 | 7 |
| 27 | 44 | 44 | 8 | 4 |

As discussed above, the lower melting temperature solder alloy may be an Sn-rich solder alloy (Sn>80 wt %). For example, the alloy may be SnAg, SnCu, SnAgCu, SnSb, SnAgY (Y=Bi, Co, Ge, In, Ni, P, Sb, or some other dopant), SnCuY (Y=Bi, Co, Ge, In, Ni, P, Sb, or some other dopant), or SnAgCuY (Y=Bi, Co, Ge, In, Ni, P, Sb, Zn, or some other dopant). The solidus temperature of the lower temperature solder alloy may range from about 200° C. to 250° C. Table 2 below, shows examples of Sn-rich alloys that may be utilized for the lower temperature solder alloy, in accordance with implementations of the disclosure. In some implementations, additives of Bi, In, and/or Ni may be included in the solder alloy to enhance its ductility or improve wetting performance.

TABLE 2

| # | Sn (wt %) | Ag (wt %) | Cu (wt %) | Sb (wt %) | Bi (wt %) | In (wt %) | Ni (wt %) |
|---|---|---|---|---|---|---|---|
| 1 | 99.3 | | 0.7 | | | | |
| 2 | 98.5 | 1 | 0.5 | | | | |
| 3 | 96.5 | 3 | 0.5 | | | | |
| 4 | 95.5 | 3.8 | 0.7 | | | | |
| 5 | 90 | 3.8 | 0.7 | 5.5 | | | |
| 6 | 89.3 | 3.8 | 0.9 | 5.5 | | 0.5 | |
| 7 | 89 | 3.8 | 0.7 | 3.5 | 0.5 | 2.5 | |
| 8 | 86.8 | 3.2 | 0.7 | 5.5 | 3.2 | 0.5 | 0.1 |
| 9 | 95 | | | 5 | | | |
| 10 | 90 | | | 10 | | | |

In some implementations, the higher temperature solder powder may comprise 10 wt % to 90 wt % of the solder paste, and the lower temperature solder powder comprises 10 wt % to 90 wt % of the solder paste. To maintain the high temperature performance and the ductility of the final solder joint, the ratio of first solder alloy and the second solder alloy may be tuned. If the wt % of the first solder alloy relative to the second solder alloy is insufficient, the final solder joint may not maintain high temperature performance. On the other hand, if the wt % of the first solder alloy relative to the second solder alloy is more than enough, the solder joint may be too rigid and result in the damage to the Si die. Accordingly, the relative ratios of the first solder alloy and the second solder alloy in the paste may be chosen such that both high temperature performance and sufficient ductility may be satisfied. To this end, in some implementations, the higher temperature solder powder may more preferably comprise 50 wt % to 90 wt % of the solder paste, and the lower temperature solder powder may comprise 10 wt % to 50 wt % of the solder paste. In some implementations, the higher temperature solder powder may more preferably comprise 75 wt % to 90 wt % of the solder paste, and the lower temperature solder powder may comprise 10 wt % to 25 wt % of the solder paste. In some implementations, the lower temperature solder powder may comprise greater than 50 wt % of the solder paste. Such implementations of the solder paste may be particularly suitable for power module applications that do not necessarily require high temperature strength.

Table 3 shows the solder alloy elemental composition (in wt %) and reflow soldered joint solder elemental composition (in wt %) of solder pastes in accordance with the disclosure. The solder pastes may be utilized for HTLF (high temperature lead-free) die attach applications, or other suitable high temperature soldering applications. As depicted in these examples, the ratio of the first solder alloy to the second solder alloy may range from about 9:1 to 5:5.

ratio of heat absorption from the first melting peak of the solder paste to heat absorption from the second melting peak of the solder paste was found to be about 0.15 or less. At these ratios, it was found that a joint formed from the solder paste can maintain sufficient high temperature shear strength (>15 MPa even at 280° C.) (e.g., from having a sufficient amount of the higher melting temperature solder powder) and good ductility (e.g., from having a sufficient amount of

TABLE 3

| | First Alloy | | | | | Second Alloy | | | | | Joint Composition | | | |
|---|---|---|---|---|---|---|---|---|---|---|---|---|---|---|
| | Sn | Sb | Cu | Ag | Ratio | Sn | Sb | Cu | Ag | Ratio | Sn | Sb | Cu | Ag |
| 1 | 38 | 38 | 7 | 17 | 90% | 90.6 | 5.5 | 0.7 | 3.2 | 10% | 43.3 | 34.8 | 6.4 | 15.6 |
| 2 | 38 | 38 | 7 | 17 | 85% | 90.6 | 5.5 | 0.7 | 3.2 | 15% | 45.9 | 33.1 | 6.1 | 14.9 |
| 3 | 42 | 40 | 6 | 12 | 90% | 90.6 | 5.5 | 0.7 | 3.2 | 10% | 46.9 | 36.6 | 5.5 | 11.1 |
| 4 | 42 | 40 | 6 | 12 | 85% | 90.6 | 5.5 | 0.7 | 3.2 | 15% | 49.3 | 34.8 | 5.2 | 10.7 |
| 5 | 42 | 40 | 6 | 12 | 80% | 90.6 | 5.5 | 0.7 | 3.2 | 20% | 51.7 | 33.1 | 4.9 | 10.2 |
| 6 | 42 | 40 | 6 | 12 | 75% | 90.6 | 5.5 | 0.7 | 3.2 | 25% | 54.2 | 31.4 | 4.7 | 9.8 |
| 7 | 42 | 40 | 6 | 12 | 70% | 90.6 | 5.5 | 0.7 | 3.2 | 30% | 56.6 | 29.7 | 4.4 | 9.4 |
| 8 | 42 | 40 | 6 | 12 | 50% | 90.6 | 5.5 | 0.7 | 3.2 | 50% | 66.3 | 22.8 | 3.4 | 7.6 |
| 9 | 42 | 43 | 7 | 8 | 90% | 90.6 | 5.5 | 0.7 | 3.2 | 10% | 46.9 | 39.3 | 6.4 | 7.5 |
| 10 | 42 | 43 | 10 | 5 | 90% | 90.6 | 5.5 | 0.7 | 3.2 | 10% | 46.9 | 39.3 | 9.1 | 4.8 |
| 11 | 42 | 40 | 6 | 12 | 90% | 96.5 | | 0.5 | 3 | 10% | 47.5 | 36.0 | 5.5 | 11.1 |
| 12 | 42 | 40 | 6 | 12 | 85% | 96.5 | | 0.5 | 3 | 15% | 50.2 | 34.0 | 5.2 | 10.7 |
| 13 | 42 | 40 | 6 | 12 | 80% | 96.5 | | 0.5 | 3 | 20% | 52.9 | 32.0 | 4.9 | 10.2 |
| 14 | 42 | 40 | 6 | 12 | 75% | 96.5 | | 0.5 | 3 | 25% | 55.6 | 30.0 | 4.6 | 9.8 |
| 15 | 42 | 40 | 6 | 12 | 70% | 96.5 | | 0.5 | 3 | 30% | 58.4 | 28.0 | 4.4 | 9.3 |
| 16 | 42 | 40 | 6 | 12 | 50% | 96.5 | | 0.5 | 3 | 50% | 69.3 | 20.0 | 3.3 | 7.5 |

In some implementations involving use of the solder paste in power discrete devices/applications, the ratio of Sn:Sb in a solder joint formed from the solder paste may be around 1:1 to 1.3:1. In some implementations involving use of the solder paste in power module devices/applications, the ratio of Sn:Sb in a solder joint formed from the solder paste may be around 1:1 to 1.8:1.

Figure 3:
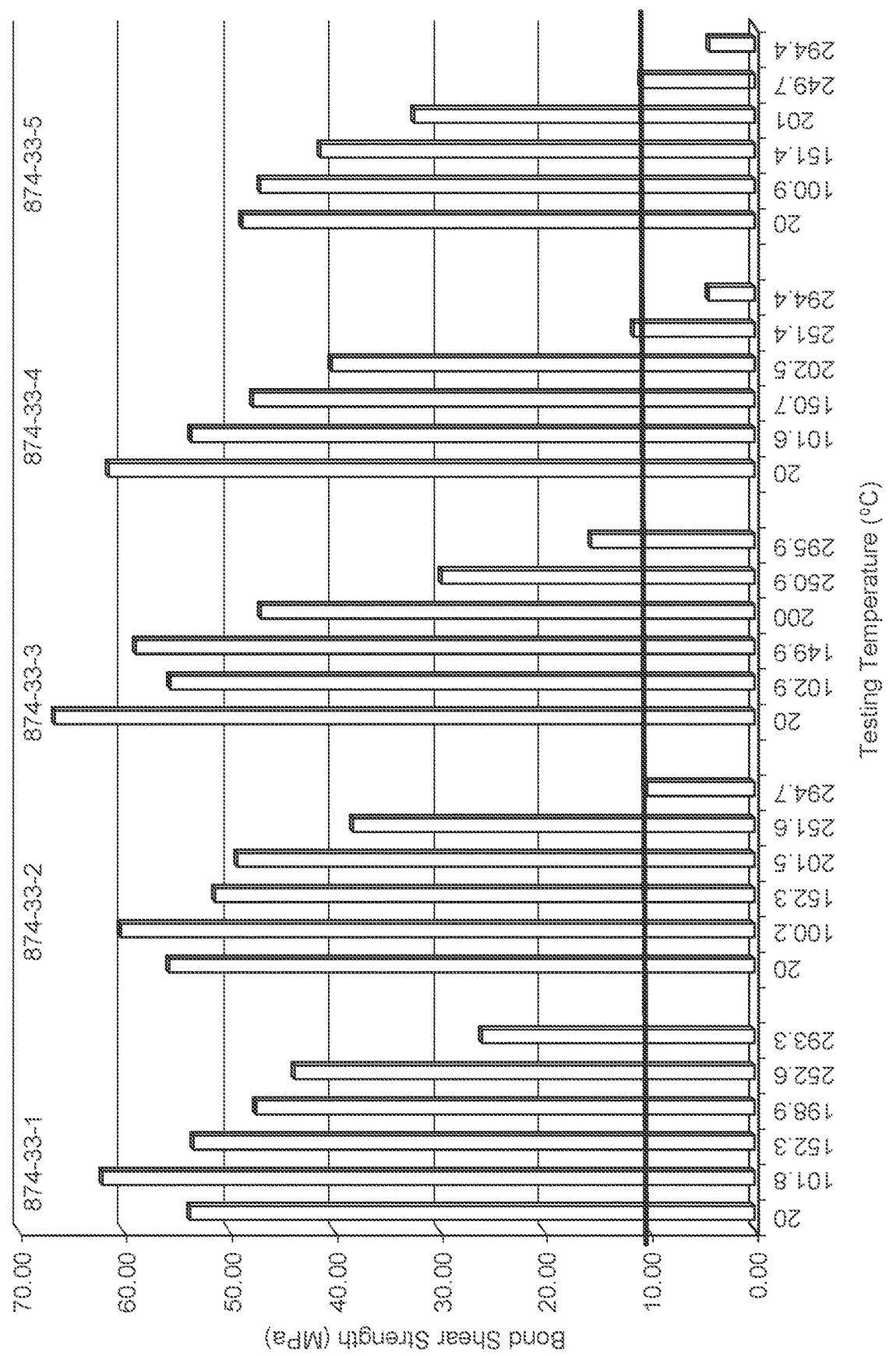
FIG. 3 is a chart plot showing the bond shear strength in MPa for different testing temperatures (° C.) for five different solder pastes.

FIG. 3 is a chart plot showing the bond shear strength (MPa) for different testing temperatures (° C.) for solder joints formed from five different solder pastes. Specifically, FIG. 3 shows the bond shear strength for the first five solder pastes of Table 3, where 874-33-1 refers to the first solder paste in Table 1, 847-33-2 refers to the second solder paste in Table 3, etc. As depicted, three out of five solder pastes (874-33-1, 874-33-2 and 874-33-3) maintained a bond shear strength of at least 10 MPa at 270° C. and above.

Figure 4:
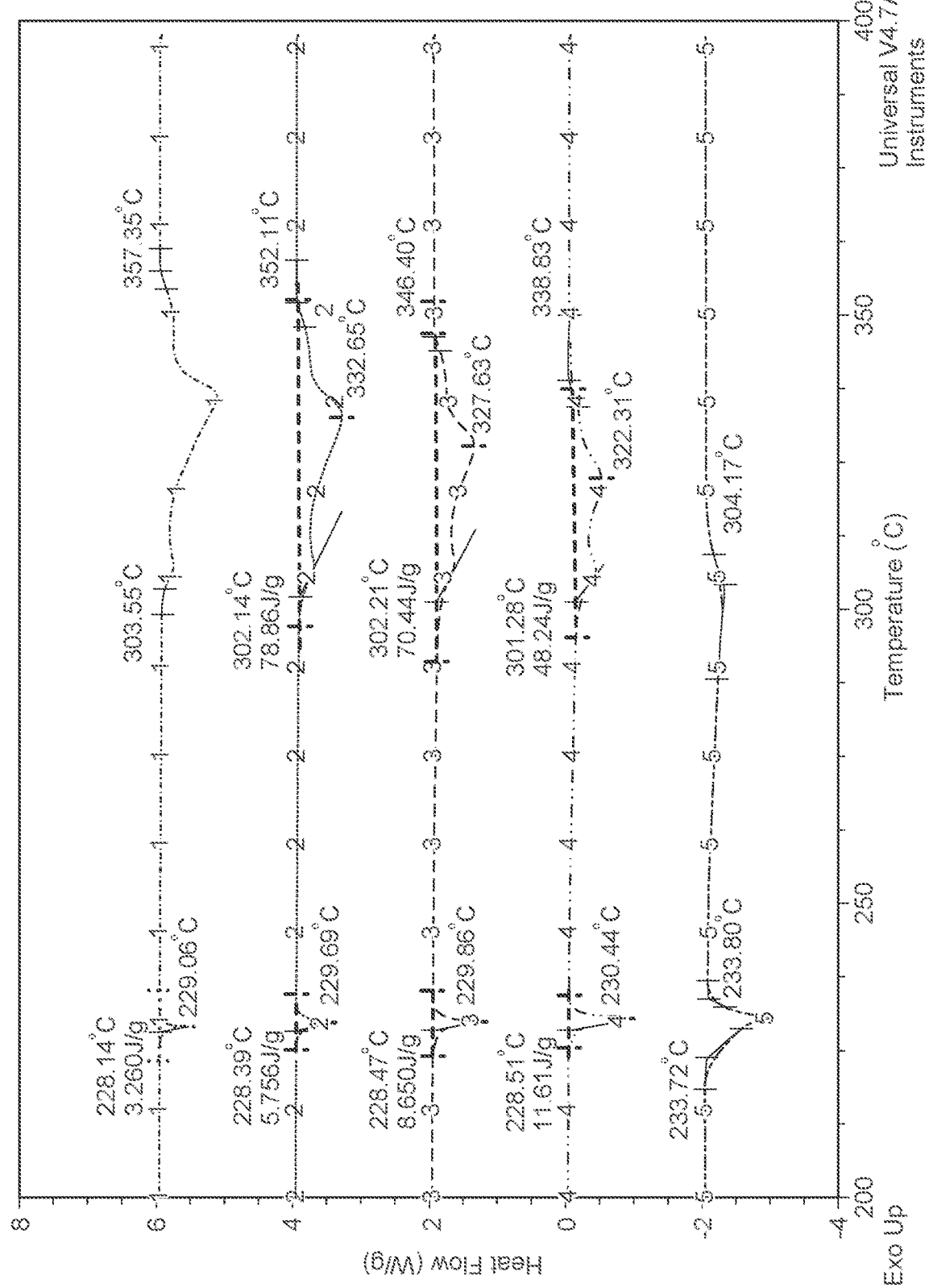
FIG. 4 shows Differential Scanning calorimeter (DSC) heating curves performed with TA Q2000 DSC for the five solder pastes depicted in FIG. 3.

FIG. 4 shows Differential Scanning calorimeter (DSC) heating curves measured with TA Q2000 DSC for the five solder pastes depicted in FIG. 3. As illustrated, for the three solder pastes (874-33-1, 874-33-2 and 874-33-3) that maintained good high temperature mechanical strength, the ratio of H1/H2 (H1: the heat absorption from the first peak of DSC and H2: the heat absorption from the second peak) is less than 0.09 while the ratio of H1/H2 for the other two solder pastes (874-33-4 and 874-33-5) is above 0.10. Table 4, below, shows the characteristics of the DSC curves.

the Sn-rich powder). In implementations, the selection of solder powders and the relative wt. % of the solder powders may be based on the H1/H2 ratio.

In contrast to TLPB technology, implementations described herein do not rely on increasing the melting temperature of the solder joint via the formation of IMCs on the surface of high melting alloys by consuming low melting alloys. In TLPB designs, the IMC forms and grows on the surface of the high melting metal/alloy powders at the expense of the low melting alloys during reflow. With increasing IMC layer thickness, the growth rate becomes significantly slower. By contrast, solder joints formed by the solder pastes described herein are not dependent on the formation of IMCs during reflow to achieve high temperature performance. Rather, high temperature performance may be obtained by selecting the appropriate percentage of the high melting phases in the final joint and by confining the low melting phases with the high melting phases after solidification.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the dis-

TABLE 4

| | First Peak | | | | Second Peak | | | | |
|---|---|---|---|---|---|---|---|---|---|
| | $T_{onset}$ (° C.) | $T_{peak}$ (° C.) | $T_{end}$ (° C.) | H1 (J/g) | $T_{onset}$ (° C.) | $T_{peak}$ (° C.) | $T_{end}$ (° C.) | H2 (J/g) | Ratio of H1/H2 |
| 874-33-1 | 227.4 | 229.1 | 230.9 | 3.26 | 303.5 | 335.9 | 358.4 | 104.4 | 0.030 |
| 874-33-2 | 228.4 | 229.7 | 233.26 | 5.76 | 302.1 | 332.65 | 352.11 | 95.79 | 0.057 |
| 874-33-3 | 228.5 | 229.9 | 232.2 | 8.65 | 301.2 | 327.6 | 346.4 | 88.08 | 0.089 |
| 874-33-4 | 225.29 | 230.44 | 233.4 | 11.61 | 301.3 | 322.3 | 338.8 | 77.81 | 0.130 |
| 874-33-5 | 220.4 | 230.5 | — | — | — | 300 | 318.2 | — | |

Based on DSC tests conducted with solder pastes in accordance with the present disclosure, a more preferable closed technology. The illustrated embodiments and their various alternatives can be implemented without confinement to the illustrated examples. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent.

What is claimed is:

1. A solder paste, consisting of:
   50 wt % to 90 wt % of a first solder alloy powder, the first solder alloy powder consisting of an SnSbCuAg solder alloy that has a wt % ratio of Sn:Sb of 0.75 to 1.1;
   10 wt % to 50 wt % of a second solder alloy powder, the second solder alloy powder consisting of an Sn solder alloy including at least 80 wt % of Sn; and
   a remainder of flux.

2. The solder paste of claim 1, wherein the solder paste consists of 75 wt % to 90 wt % of the first solder alloy powder, 10 wt % to 25 wt % of the second solder alloy powder, and the remainder of the flux.

3. The solder paste of claim 1, wherein the solidus temperature of the first solder alloy powder is 300° C. to 360° C., and wherein the solidus temperature of the second solder alloy powder is 200° C. to 250° C.

4. The solder paste of claim 3, wherein the solidus temperature of the second solder alloy powder is 215° C. to 245° C.

5. The solder paste of claim 3, wherein the liquidus temperature of the first solder alloy powder is no greater than 360° C.

6. The solder paste of claim 3, wherein the liquidus temperature of the second solder alloy powder is no greater than 250° C.

7. The solder paste of claim 4, wherein the liquidus temperature of the second solder alloy powder is no greater than 245° C.

8. The solder paste of claim 1, wherein the first solder alloy powder consists of:
   4 wt % to 10 wt % of Cu;
   4 wt % to 20 wt % of Ag;
   optionally, 0.5 wt % or less of Bi, Co, In, Ge, Ni, P, or Zn; and
   a remainder of Sn and Sb in the ratio of 0.75 to 1.1.

9. The solder paste of claim 1, wherein the second solder alloy powder is SnAg, SnCu, SnAgCu, SnSb, SnAgCuSb, SnAgY (Y=Bi, Co, Ge, In, Ni, P, Sb, or Zn), SnCuY (Y=Bi, Co, Ge, In, Ni, P, Sb, or Zn), SnAgCuY (Y=Bi, Co, Ge, In, Ni, P, Sb, or Zn), or SnAgCuSbY (Y=Bi, Co, Ge, In, Ni, P, Sb, or Zn).

10. The solder paste of claim 9, wherein the second solder alloy powder comprises 0.1 to 4 wt % Ag, 0.1 to 1 wt % Cu, or 0.1 to 11 wt % Sb.

11. The solder paste of claim 10, wherein the second solder alloy powder comprises 0.1 to 4 wt % Ag, 0.1 to 1 wt % Cu, and 0.1 to 11 wt % Sb.

12. The solder paste of claim 11, wherein the second solder alloy powder is doped with Bi, Co, Ge, In, Ni, P, or Zn.

13. The solder paste of claim 1, wherein a ratio of heat absorption from a first melting peak of the solder paste to heat absorption from a second melting peak of the solder paste is 0.15 or less.

14. A method, comprising:
   applying a solder paste between a substrate and device to form an assembly, wherein the solder paste consists of:
     50 wt % to 90 wt % of a first solder alloy powder, the first solder alloy powder consisting of an SnSbCuAg solder alloy that has a wt % ratio of Sn:Sb of 0.75 to 1.1; 10 wt % to 50 wt % of a second solder alloy powder, the second solder alloy powder consisting of an Sn solder alloy including at least 80 wt % of Sn; and
     a remainder of flux;
   performing a first reflow soldering process with the assembly at a peak temperature of greater than 320° C. to form a solder joint from the solder paste; and
   after forming the solder joint, performing a second reflow soldering process with the assembly at a peak temperature of 230° C. to 270° C.

15. The method of claim 14, wherein the device is a silicon die, the substrate comprises a Cu lead frame, and the solder paste is applied between the Cu lead frame and the silicon die.

16. The method of claim 14, wherein:
   the solidus temperature of the first solder alloy powder is 300° C. to 360° C.; and
   the solidus temperature of the second solder alloy powder is 200° C. to 250° C.

17. The method of claim 14, wherein during the second reflow soldering process, the solder joint maintains a bond shear strength greater than or equal to 10 MPa.

18. A solder joint formed by the process of:
   applying a solder paste between a substrate and a device to form an assembly; and
   reflow soldering the assembly to form the solder joint;
   wherein the solder paste consists of:
     50 wt % to 90 wt % of a first solder alloy powder, the first solder alloy powder consisting of an SnSbCuAg solder alloy that has a wt % ratio of Sn:Sb of 0.75 to 1.1;
     10 wt % to 50 wt % of a second solder alloy powder, the second solder alloy powder consisting of an Sn solder alloy including at least 80 wt % of Sn; and
     a remainder of flux.

* * * * *